US010473705B2

(12) United States Patent
Kuo

(10) Patent No.: US 10,473,705 B2
(45) Date of Patent: Nov. 12, 2019

(54) DEVICES AND METHODS FOR DETECTING ELECTROSTATICALLY SENSITIVE AREAS

(71) Applicant: Quanta Computer Inc., Taoyuan (TW)

(72) Inventor: Chao-Hung Kuo, Taoyuan (TW)

(73) Assignee: QUANTA COMPUTER INC., Taoyuan (TW)

(*) Notice: Subject to any disclaimer, the term of this patent is extended or adjusted under 35 U.S.C. 154(b) by 169 days.

(21) Appl. No.: 15/675,973

(22) Filed: Aug. 14, 2017

(65) Prior Publication Data
US 2018/0313881 A1 Nov. 1, 2018

(30) Foreign Application Priority Data
Apr. 26, 2017 (TW) .............................. 106113886 A

(51) Int. Cl.
G01R 29/12 (2006.01)
G01R 29/24 (2006.01)
G01R 15/16 (2006.01)
G01R 31/00 (2006.01)

(52) U.S. Cl.
CPC ........... G01R 29/12 (2013.01); G01R 15/165 (2013.01); G01R 29/24 (2013.01); G01R 31/002 (2013.01)

(58) Field of Classification Search
CPC ....... G01R 29/12; G01R 15/165; G01R 29/24
USPC ........................................................ 324/457
See application file for complete search history.

(56) References Cited

U.S. PATENT DOCUMENTS

2013/0106434 A1* 5/2013 Chung ................. G01R 31/001
324/612
2014/0062994 A1* 3/2014 Chen ...................... G09G 5/003
345/214
2016/0154042 A1* 6/2016 Kikunaga .............. G01R 29/24
324/457

FOREIGN PATENT DOCUMENTS

CN          105431744 A        3/2016

OTHER PUBLICATIONS

Chinese language office action dated Jan. 17, 2018, issued in application No. TW 106113886.

* cited by examiner

Primary Examiner — Melissa J Koval
Assistant Examiner — Courtney G McDonnough
(74) Attorney, Agent, or Firm — McClure, Qualey & Rodack, LLP

(57) ABSTRACT

An electrostatic detecting device, which is configured to detect an electrostatically sensitive area of an electronic device causing a specific event to happen to an electronic device, includes an electrostatic metal plate, a detector, and a controller. The electrostatic metal plate is configured to generate an electrical field and includes a first surface which is parallel to the electronic device. When the specific event is detected, the detector generates a detection signal. The controller moves the first surface relative to the electronic device and receives the detection signal. When the detection signal is received, the controller determines that the electrostatically sensitive area is a first area of the electronic device overlapped with the first surface.

8 Claims, 5 Drawing Sheets

DEVICES AND METHODS FOR DETECTING ELECTROSTATICALLY SENSITIVE AREAS

CROSS REFERENCE TO RELATED APPLICATIONS

This application claims priority of Taiwan Patent Application No. 106113886, filed on Apr. 26, 2017, the entirety of which is incorporated by reference herein.

BACKGROUND OF THE INVENTION

Field of the Invention

The disclosure relates generally to devices and methods for detecting an electrostatically sensitive area in an electronic device.

Description of the Related Art

With semiconductors being manufactured at smaller sizes so that they are increasingly convenient for a user to carry, the printed circuit boards inside such electronic products are likewise getting smaller, and so the electronic components on the printed circuit board are getting more concentrated as well. In addition, to perform the more complicated electronic functions, the high logic level and the low logic level in an integrated circuit are getting closer, so that it is harder for an electronic product to meet the criterion of electrostatic tolerance.

For engineers, the biggest difficulty in improving electrostatic tolerance is how to search for an area that can be interfered with by static electricity, such that searching for the electrostatically sensitive area is time-wasting. Therefore, an effective electrostatic detecting device and method is required to improve the efficiency of finding out an area that can be interfered with by static electricity.

BRIEF SUMMARY OF THE INVENTION

For solving above problem, the invention provides a device manufactured according to the principles of electromagnetic induction to improve the efficiency of searching for areas that can be interfered with by static electricity.

In an embodiment, an electrostatic detecting device configured to detect an electrostatically sensitive area that causes a specific event to happen to an electronic device comprises: an electrostatic metal plate, a detector, and a controller. The electrostatic metal plate is configured to generate an electrical field and comprises a first surface which is parallel to the electronic device. When the detector detects that the specific event has happened to the electronic device, the detector generates a detection signal. The controller moves the first surface relative to the electronic device and receives the detection signal. The controller determines that the electrostatically sensitive area is a first area of the electronic device overlapping with the first surface when the controller receives the detection signal.

According to an embodiment of the invention, the electrostatic detecting device further comprises: a first supporting part. The first supporting part is configured to support the electrostatic metal plate and to move according to a first control signal. The controller further generates the first control signal so that the first surface moves relative to the electronic device.

According to an embodiment of the invention, the specific event is a black-screen event, a restart event, or a shut-down event.

According to an embodiment of the invention, the electrostatic detecting device further comprises: a magnetic-field generating device. The magnetic-field generating device is configured to generate a time-variant magnetic field, which comprises: a metal rod and a metal line. The metal rod consists of a ferromagnetic material with magnetism and comprising a second surface which is smaller than the first surface and parallel to the electronic device. The metal line is wrapped around the metal rod. A high-frequency current flows through the metal line. The controller moves the second surface relative to the first area. The controller determines that the electrostatically sensitive area is a second area of the electronic device overlapping with the second surface.

According to an embodiment of the invention, the electrostatic detecting device further comprises: a second supporting part. The second supporting part is configured to support the magnetic-field generating device and to move according to a second control signal. The controller further generates the second control signal, so that the second surface moves relative to the first area.

In an embodiment, an electrostatic detecting method, which is configured to detect an electrostatically sensitive area causing a specific event to happen to an electronic device, comprises: moving the first surface of an electrostatic metal plate relative to the electronic device, wherein the electrostatic metal plate is configured to generate an electrical field, and the first surface is parallel to the electronic device; detecting whether the specific event has happened to the electronic device; and determining that the electrostatically sensitive area is a first area of the electronic device overlapping with the first surface when the specific event happening to the electronic device is detected.

According to an embodiment of the invention, the step of moving the first surface of the electrostatic metal plate relative to the electronic device comprises: supporting the electrostatic metal plate with a first supporting part; and moving the first supporting part, so that the first surface moves relative to the electronic device.

According to an embodiment of the invention, the specific event is a black-screen event, a restart event, or a shut-down event.

According to an embodiment of the invention, the electrostatic detecting method further comprises: moving a second surface of a magnetic-field generating device relative to the first area, wherein the magnetic-field generating device is configured to generate a time-variant magnetic field, and the second surface is smaller than the first surface and parallel to the electronic device; detecting whether the specific event has happened to the electronic device; and determining that the electrostatically sensitive area is a second area of the electronic device overlapping with the second surface when the specific event happening to the electronic device is detected.

According to an embodiment of the invention, the step of moving the second surface of the magnetic-field generating device relative to the first area comprises: supporting the magnetic-field generating device with a second supporting part; and moving the second supporting part, so that the second surface moves relative to the first area.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
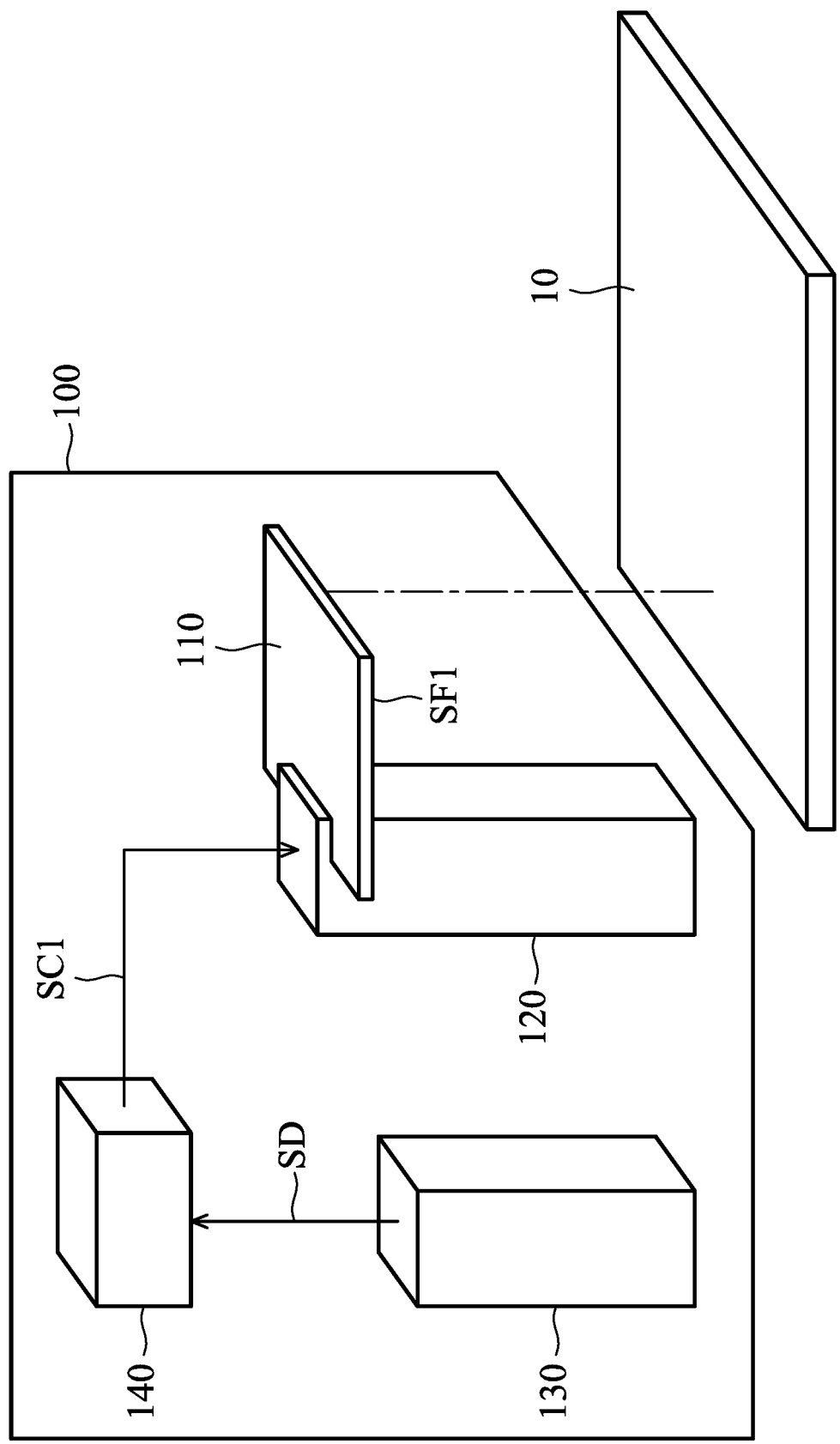
FIG. 1 is a block diagram of an electrostatic detecting device in accordance with an embodiment of the invention.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It should be understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, so that the features may not be in direct contact.

FIG. 1 is a block diagram of an electrostatic detecting device in accordance with an embodiment of the invention. As shown in FIG. 1, the electrostatic detection device 100 is configured to detect the electrostatically sensitive area causing a specific event to happen to an electronic device 10, in which the electrostatic detecting device 100 includes an electrostatic metal plate 110, a first supporting part 120, a detector 130, and a controller 140. According to an embodiment of the invention, the specific event is a black-screen event, a restart event, or a shut-down event due to the electrostatically sensitive area of the electronic device 10 that is interfered with by static electricity. According to other embodiments of the invention, the specific event could be any error event caused by the electrostatically sensitive area of the electronic device 10 being interfered with by static electricity.

The electrostatic metal plate 110 is configured to generate an electrical field without coming into contact with the electronic device 10. According to an embodiment of the invention, the electrostatic metal plate 110 and the electronic device 10 are parallel to each other. According to an embodiment of the invention, the charge is implanted to the electrostatic metal plate 110 by an electrostatic gun, so that the electrostatic metal plate 110 generates an electrical field. According to an embodiment of the invention, the electrostatic metal plate 110 may be a metal plate of any shape and any thickness. According to an embodiment of the invention, the electrostatic metal plate 110 may be a conductive copper foil or an aluminum foil. According to another embodiment of the invention, the electrostatic metal plate 110 may be a foil of any metal.

The first supporting part 120 is configured to support the electrostatic metal plate 110, so that the first surface SF1 of the electrostatic metal plate 110 does not come into contact with the electronic device 10. According to an embodiment of the invention, the first surface SF1 and the electronic device 10 are parallel to each other. According to another embodiment of the invention, the first surface SF1 is located a predetermined distance away from the electronic device 10. In addition, the first supporting part 120 moves the electrostatic metal plate 110 relative to the electronic device 10 without coming into contact with the electronic device 10 according to the first control signal SC1, in order to search for an electrostatically sensitive area of the electronic device 10. According to an embodiment of the invention, the first supporting part 120 is an insulator so that the charge is able to stay on the electrostatic metal plate 110.

The detector 130 is configured to detect whether the specific event has happened to the electronic device 10. When the detector 130 detects that the specific event has happened to the electronic device 10, the detector 130 generates a detection signal SD to the controller 140. The controller 140 is configured to generate a first control signal SC1 to move the first supporting part 120, so that the first surface SF1 moves relative to the electronic device 10. When the controller 140 receives the detection signal SD, the controller determines that the electrostatically sensitive area is the area of electronic device 10 that overlaps with the first surface SF1.

According to an embodiment of the invention, when the specific event is a black-screen event, the detector 130 is a charge-coupled device which is configured to detect the display of the electronic device 10. According to another embodiment of the invention, when the specific event is a restart event or a shut-down event, the detector 130 is a current detector which is configured to detect the current variance of the electronic device 10, so that the controller 140 determines that the specific event is a restart event or a shut-down event according to the detection signal SD.

Figure 2:
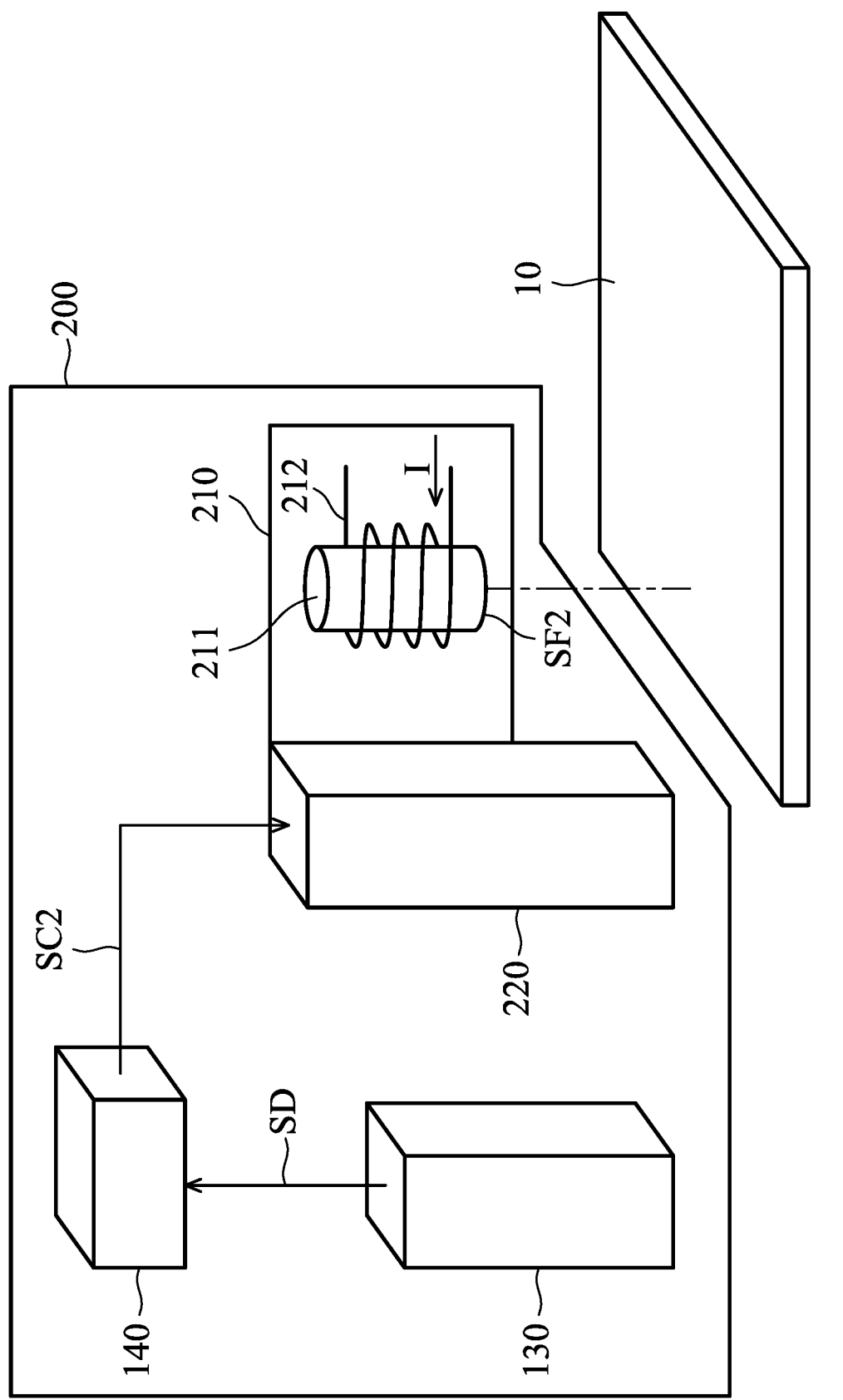
FIG. 2 is a block diagram of an electrostatic detecting device in accordance with another embodiment of the invention.

FIG. 2 is a block diagram of an electrostatic detecting device in accordance with another embodiment of the invention. As shown in FIG. 2, the electrostatic detection device 200 is configured to detect the electrostatically sensitive area causing the specific event to happen to the electronic device 10, in which the electrostatic detection device 200 includes a magnetic-field generating device 210, a second supporting part 220, a detector 130, and a controller 140. According to an embodiment of the invention, the specific event may be any error event caused by an electrostatic problem happening to the electrostatically sensitive area of the electronic device 10. According to other embodiments of the invention, the specific event may be a black-screen event, a restart event, or a shut-down event.

The magnetic-field generating device 210 includes a metal rod 211 and a metal line 212. The metal rod 211, which is made of a ferromagnetic material, includes a second surface SF2. The second surface SF2 is smaller than the first surface SF1, and the second surface SF2 is parallel to the electronic device 10. The metal line 212 is wrapped around the metal rod 211 and a high-frequency current I flows through the metal line 212, so that the magnetic-field generating device 210 generates a time-variant magnetic field. According to an embodiment of the invention, the high-frequency current I is generated by an electrostatic gun.

The second supporting part 220 is configured to support the magnetic-field generating device 210, so that the second surface SF2 of the magnetic-field generating device 210 does not come into contact with the electronic device 10. According to an embodiment of the invention, the second surface SF2 and the electronic device 10 are parallel to each other. According to another embodiment of the invention, the second surface SF2 is located a predetermined distance away from the electronic device 10. In addition, the second supporting part 220 moves the magnetic-field generating device 210 relative to the electronic device 10 without coming into contact with the electronic device 10 according to the second control signal SC2, in order to search the electrostatically sensitive area of the electronic device 10. According to an embodiment of the invention, the second supporting part 220 is an insulator.

The detector 130 is configured to detect whether the specific event has happened to the electronic device 10. When the detector 130 detects that the specific event has happened to the electronic device 10, the detector 130 generates the detection signal SD to the controller 140. The controller 140 is configured to generate the second control signal SC2 to move the second supporting part 220, so that the second surface SF2 moves relative to the electronic device 10. When the controller 140 receives the detection signal SD, the controller 140 determines that the electrostatically sensitive area is the area of the electronic device 10 overlapping with the second surface SF2.

According to an embodiment of the invention, the controller 140 merely utilizes the electrostatic metal plate 110 or the magnetic-field generating device 210 to search the electrostatically sensitive area of the electronic device 10. According to another embodiment of the invention, after the controller 140 utilizes the electrostatic metal plate 110 to determine that the electrostatically sensitive area is the area of the electronic device 10 that overlaps with the first surface SF1, the controller further utilizes the magnetic-field generating device 210 to search the area of the electronic device 10 overlapping with the first surface SF1. As shown in FIGS. 1 and 2, since the second surface SF2 of the magnetic-field generating device 210 is smaller than the first surface SF1 of the electrostatic metal plate 110, the utilization of the magnetic-field generating device 210 would be helpful in shrinking the possible range of the electrostatically sensitive area.

According to an embodiment of the invention, the following description will describe in detail how the electrostatic detection device 100 in FIG. 1 and the electrostatic detection device 200 detect the electrostatically sensitive area.

Figure 3A:
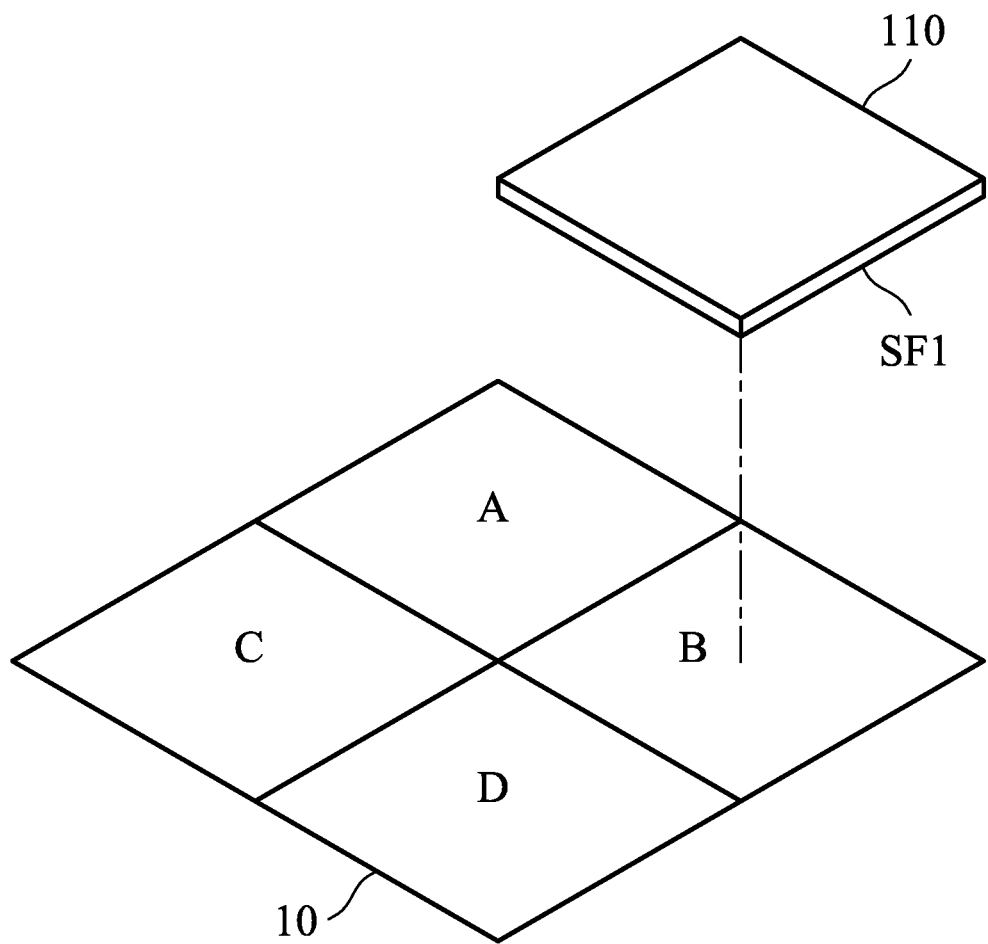
FIGS. 3A and 3B are schematic diagrams of detecting the electrostatically sensitive area by the electrostatic detecting device in accordance with an embodiment of the invention.
Figure 3B:
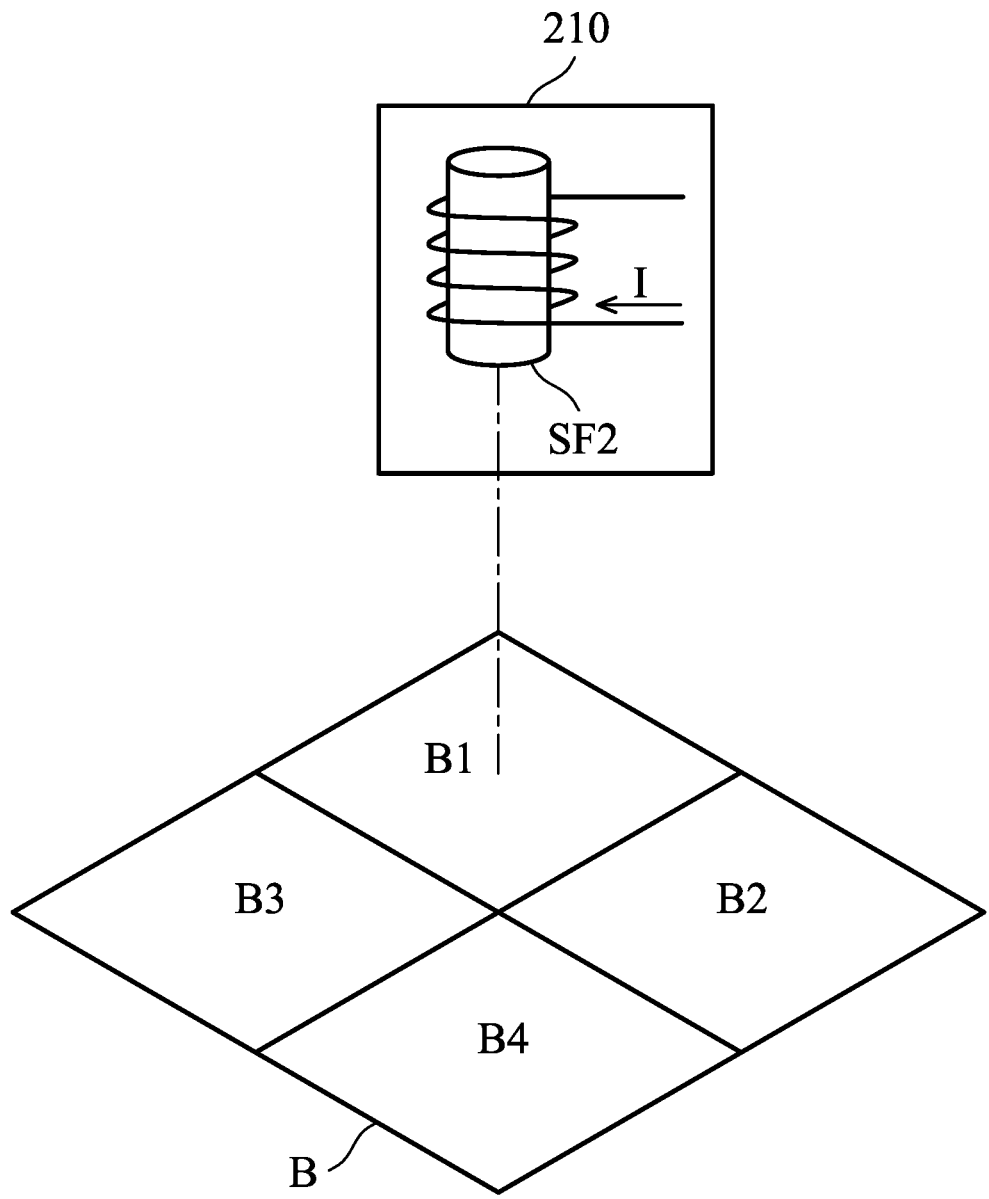

FIGS. 3A and 3B are schematic diagrams of how the electrostatic detecting device detects the electrostatically sensitive area in accordance with an embodiment of the invention. When the specific event has happened to the electronic device 10 during an electrostatic test, as shown in FIG. 3A, the controller 140 utilizes the electrostatic metal plate 110 to search whether the electrostatically sensitive area causing the specific event to happen to the electronic device 10 is in the first region A, the second region B, the third region C, or the fourth region D.

According to other embodiments of the invention, the specific event is a black-screen event, a restart event, or a shut-down event. According to an embodiment of the invention, the electronic device 10 could be divided into any number of regions according to the first surface SF1 of the electrostatic metal plate 110. The electronic device 10 divided into the first region A, the second region B, the third region C, and the fourth region D is merely illustrated herein. It is not intended to limit the scope of the invention.

For instance, when the controller 140 moves the electrostatic metal plate 110 to the second region B, the detector 130 detects that the specific event has happened to the electronic device 10 to generate the detection signal SD. According to an embodiment of the invention, when the controller 140 determines that an identical specific event is repeatedly happening according to the detection signal SD, the controller 140 determines that the second region B is the electrostatic sensitive region.

For instance, a shut-down event has happened to the electronic device 10 due to interference from static electricity. When the controller 140 moves the electrostatic metal plate 110 to the first region A, the controller 140 determines, according to the detection signal SD, that a restart event has happened, instead of a shut-down event. That is, the specific event that has happened to the electronic device 10 when the electrostatic metal plate 110 is moved to the first region A does not match that which has happened to the electronic device 10 due to interference from static electricity. Therefore, the electrostatic metal plate 110 moves to the second region B.

When the electrostatic metal plate 110 is moved to the second region B, the controller 140 determines that a shut-down event has happened to the electronic device 10, which means that the second region B is the electrostatically sensitive area causing the shut-down event to happen to the electronic device 10. Therefore, the controller 140 determines that the second region B is the electrostatically sensitive area causing the shut-down event to happen to the electronic device 10.

As shown in FIG. 3B, the controller 140 further utilizes the magnetic-field generating device 210 to search whether the electrostatically sensitive area in the electronic device 10 is the first sub-region B1, the second sub-region B2, the third sub-region B3, or the fourth sub-region B4, in order to shrink the range of the electrostatically sensitive area of the electronic device 10. The second region B in FIG. 3B corresponds to the second region B in FIG. 3A, in which the second region B in FIG. 3B is divided into the first sub-region B1, the second sub-region B2, the third sub-region B3, and the fourth sub-region B4.

According to an embodiment of the invention, the electronic device 10 may be divided into any number of regions according to the second surface SF2 of the magnetic-field generating device 210. The second region B divided into the first sub-region B1, the second sub-region B2, the third sub-region B3, and the fourth sub-region B4 is merely illustrated herein. It is not intended to limit the scope of the invention.

Since the second surface SF2 of the magnetic-field generating device 210 is smaller than the first surface SF1 of the electrostatic metal plate 110, the magnetic-field generating device 210 is able to effectively shrink the range of the electrostatically sensitive area of the electronic device 10. According to an embodiment of the invention, when the magnetic-field generating device 210 is moved to the second sub-region B2, the detector 130 detects that the specific event has happened to the electronic device 10 and then generates the detection signal SD.

When the controller 140 determines, according to the detection signal SD, that an identical specific event has happened, the controller 140 determines the second sub-region B2 is the electrostatically sensitive area causing the specific event to happen to the electronic device 10. Therefore, after searching using the electrostatic metal plate 110 and the magnetic-field generating device 210, the electrostatically sensitive area of the electronic device 10 is shrunk to the size of the second surface SF2, so that it is easier for the engineer to analyze the reason for the electrostatic interference.

Figure 4:
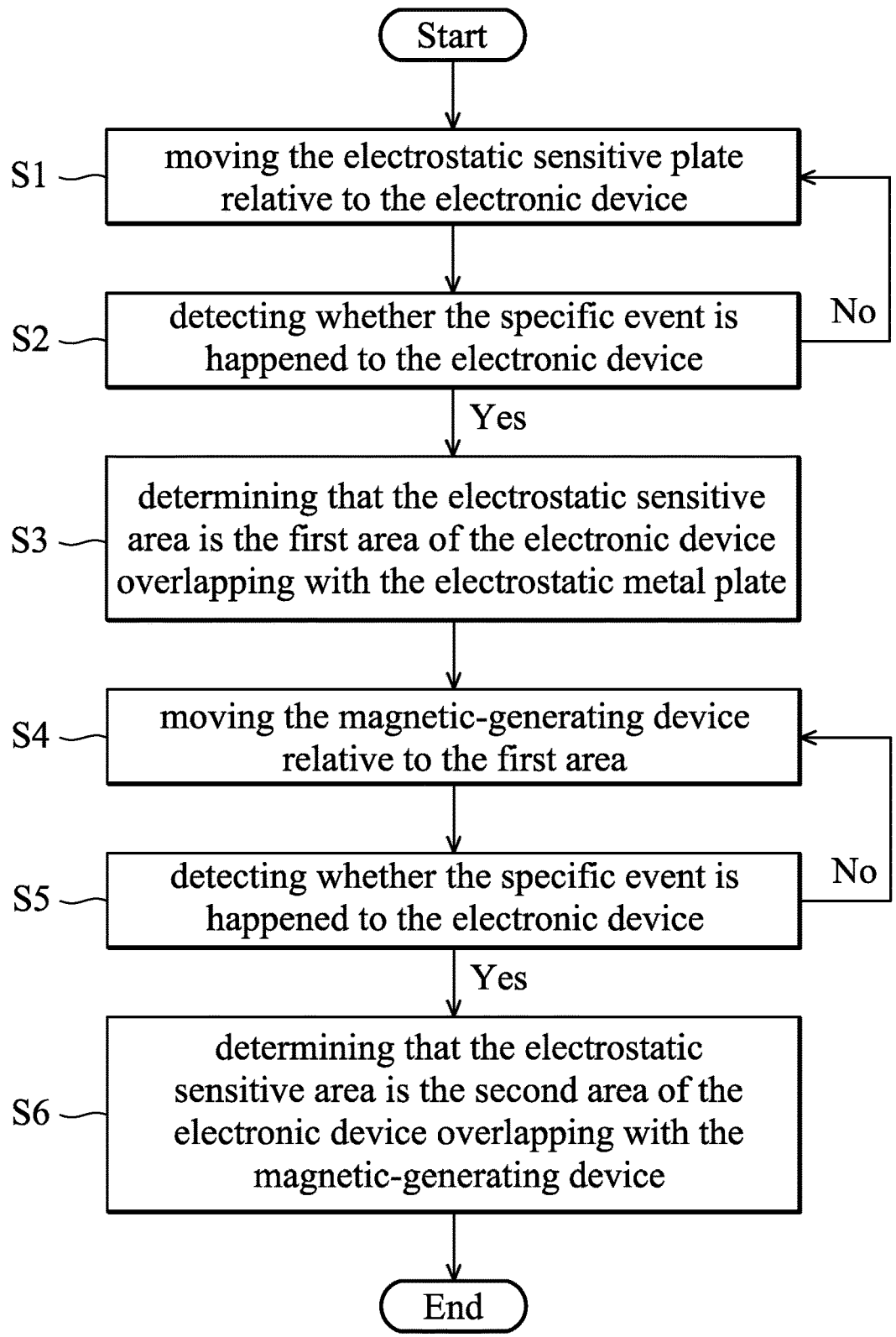
FIG. 4 is a flow chart of an electrostatic detecting method in accordance with an embodiment of the invention.

FIG. 4 is a flow chart of an electrostatic detecting method in accordance with an embodiment of the invention. For the convenience of explanation, the flow chart in FIG. 4 is explained with FIGS. 1 and 2. As shown in FIG. 4, the first surface SF1 of the electrostatic metal plate 110 moves relative to the electronic device 10 (Step S1). The electronic device 10 is examined to determine whether the specific event has happened (Step S2). When it is detected that the specific event has happened to the electronic device 10, the electrostatically sensitive area is determined to be the first area of the electronic device 10 overlapping with the electrostatic metal plate 110 (Step S3). Back to Step S2, when the specific event is not detected, return to Step S1.

Then, the second surface SF2 of the magnetic-field generating device 210 moves relative to the electrostatically sensitive area (Step S4). The electronic device 10 is examined in order to determine whether the specific event has happened (Step S5). When it is detected that the specific event has happened to the electronic device 10, the electrostatically sensitive area is the second area of the electronic device 10 overlapping with the magnetic-field generating device 210 (Step S6). Back to Step S5, when the specific event is not detected, return to Step S4.

The engineer can systematically and effectively discover the electrostatically sensitive area of the electronic device by utilizing the electrostatic detecting device and the electrostatic detecting method provided herein, so that engineering time may be shortened and the production cost could be lowered.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An electrostatic detecting device, configured to detect an electrostatically sensitive area causing a specific event to happen to an electronic device, comprising:
    an electrostatic metal plate, configured to generate an electrical field and comprising a first surface, wherein the first surface is parallel to the electronic device;
    a detector, wherein when the detector detects that the specific event has happened to the electronic device, the detector generates a detection signal; and
    a controller, moving the first surface relative to the electronic device and receiving the detection signal, wherein the controller determines that the electrostatically sensitive area is a first area of the electronic device overlapping with the first surface when the controller receives the detection signal; and
    a magnetic-field generating device, configured to generate a time-variant magnetic field, wherein the magnetic-field generating device comprises:
        a metal rod, consisting of a ferromagnetic material with magnetism and comprising a second surface, wherein the second surface is smaller than the first surface and parallel to the electronic device; and
        a metal line, wrapped around the metal rod, wherein a high-frequency current flows through the metal line, wherein the controller moves the second surface relative to the first area, wherein the controller determines that the electrostatically sensitive area is a second area of the electronic device overlapping with the second surface.

2. The electrostatic detecting device of claim 1, further comprising:
    a first supporting part, configured to support the electrostatic metal plate and to move according to a first control signal, wherein the controller further generates the first control signal so that the first surface moves relative to the electronic device.

3. The electrostatic detecting device of claim 1, wherein the specific event is a black-screen event, a restart event, or a shut-down event.

4. The electrostatic detecting device of claim 1, further comprising:
    a second supporting part, configured to support the magnetic-field generating device and to move according to a second control signal, wherein the controller further generates the second control signal, so that the second surface moves relative to the first area.

5. An electrostatic detecting method, configured to detect an electrostatically sensitive area causing a specific event to happen to an electronic device, comprising:
    moving a first surface of an electrostatic metal plate relative to the electronic device, wherein the electrostatic metal plate is configured to generate an electrical field, and the first surface is parallel to the electronic device;
    detecting whether the specific event has happened to the electronic device;
    determining that the electrostatically sensitive area is a first area of the electronic device overlapping with the first surface when the specific event happening to the electronic device is detected;
    moving a second surface of a magnetic-field generating device relative to the first area, wherein the magnetic-field generating device is configured to generate a time-variant magnetic field, and the second surface is smaller than the first surface and parallel to the electronic device;
    detecting whether the specific event has happened to the electronic device; and
    determining that the electrostatically sensitive area is a second area of the electronic device overlapping with the second surface when the specific event happening to the electronic device is detected.

6. The electrostatic detecting method of claim 5, wherein the step of moving the first surface of the electrostatic metal plate relative to the electronic device comprises:
    supporting the electrostatic metal plate with a first supporting part; and
    moving the first supporting part, so that the first surface moves relative to the electronic device.

7. The electrostatic detecting method of claim 5, wherein the specific event is a black-screen event, a restart event, or a shut-down event.

8. The electrostatic detecting method of claim 5, wherein the step of moving the second surface of the magnetic-field generating device relative to the first area comprises:
    supporting the magnetic-field generating device with a second supporting part; and
    moving the second supporting part, so that the second surface moves relative to the first area.

* * * * *